United States Patent [19]

Gunton

[11] 4,353,043

[45] Oct. 5, 1982

[54] SURFACE ACOUSTIC WAVE DEVICES AND SYSTEMS INCLUDING SUCH DEVICES

[75] Inventor: David J. Gunton, Malvern, England

[73] Assignee: The Secretary of State for Defence in Her Britannic Majesty's Government of the United Kingdom of Great Britain and Northern Ireland, London, England

[21] Appl. No.: 197,370

[22] Filed: Oct. 15, 1980

[30] Foreign Application Priority Data

Oct. 22, 1979 [GB] United Kingdom ............... 7936587

[51] Int. Cl.³ .................. H03H 9/64; H03H 9/68; H03H 9/72
[52] U.S. Cl. ..................... 333/151; 310/313 D; 333/153; 333/194; 333/195
[58] Field of Search ................. 333/150–155, 333/193–196, 100; 310/313 R, 313 A, 313 B, 313 C, 313 D

[56] References Cited

U.S. PATENT DOCUMENTS 3,836,876  9/1974  Marshall et al. ............. 333/100 X
4,038,614  7/1977  Chapman et al. ............. 333/153

*Primary Examiner*—Marvin L. Nussbaum
*Attorney, Agent, or Firm*—Pollock, VandeSande & Priddy

[57] ABSTRACT

A two track surface acoustic wave device is provided with a phase plate interposed between input and output transducers on one of the two tracks. An electrical coupler is connected across the output transducers to produce a sum signal at at least one of its outputs corresponding to surface waves making a single transit of each track. The coupler combines other signals having a different phase relationship—eg those corresponding to a triple transit of each track to give a null at one of these outputs. The coupler is connected into matched output loads to provide mutual isolation at its inputs. Tracks of different length may be used instead of the phase plate. Instead of electrical coupling, acoustic coupling may be provided between the two tracks to produce a similar result.

13 Claims, 6 Drawing Figures

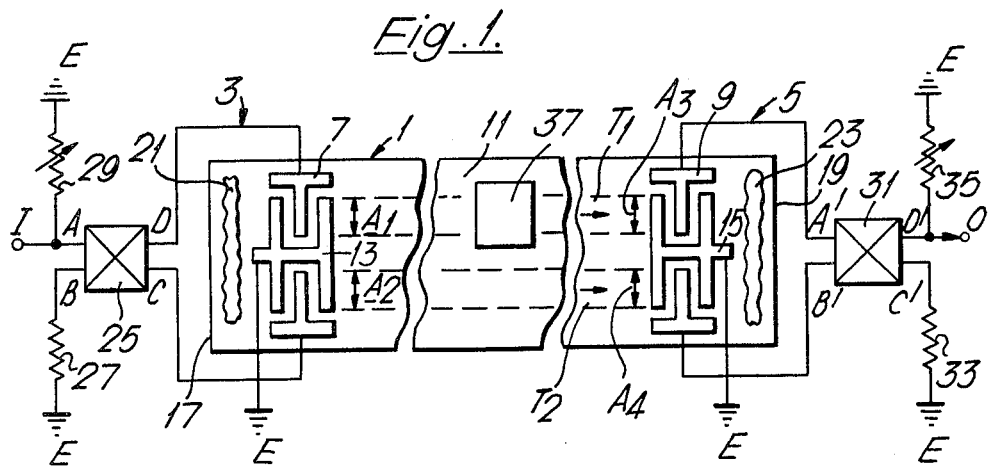
Fig. 1.
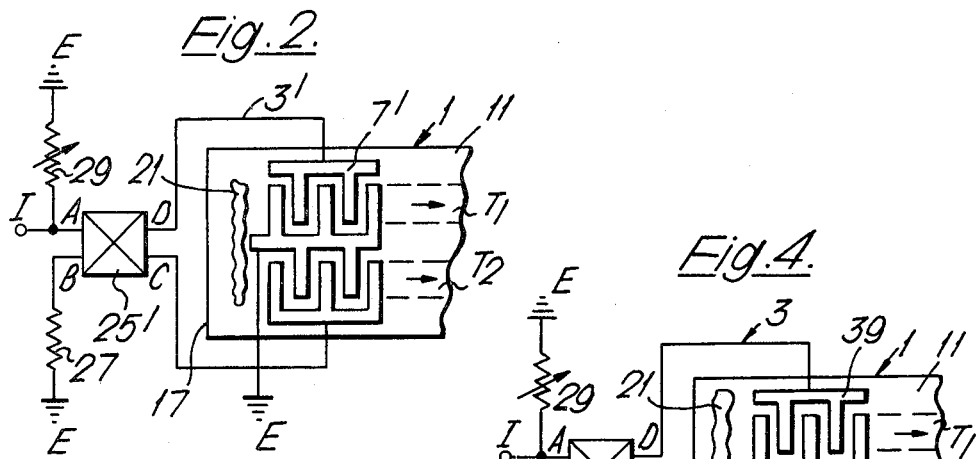
Fig. 2.
Fig. 4.
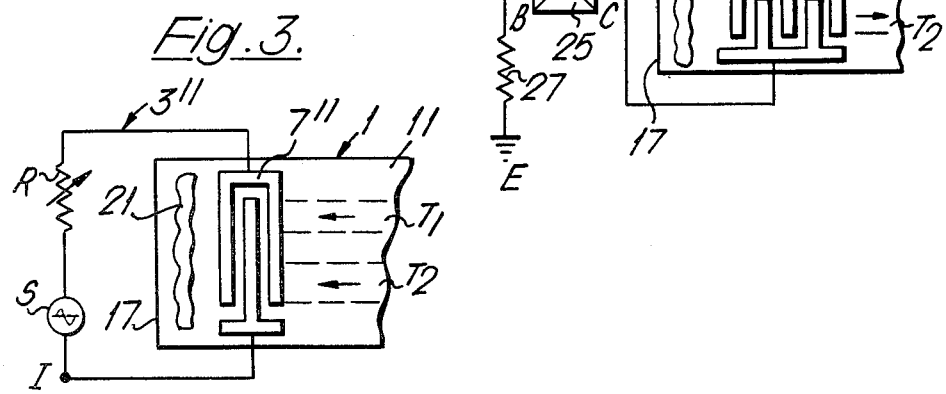
Fig. 3.

SURFACE ACOUSTIC WAVE DEVICES AND SYSTEMS INCLUDING SUCH DEVICES

The present invention concerns surface acoustic wave, and acoustic interface wave, devices, and also systems which include input and output loads connected to these devices. The term "surface acoustic waves" will be used hereinafter to include acoustic interface waves as well as surface acoustic waves.

Surface acoustic wave devices are being proposed for an increasingly large number of electronic purposes, and surface acoustic wave filters and delay lines are likely to find important applications in the future. Such devices commonly comprise a transducer for launching surface acoustic waves along a predetermined track (which must be along a surface or an interface of a material capable of supporting surface acoustic waves, but need not have any other particular configuration or boundaries) and at least one other transducer for detecting the surface acoustic waves and generating electrical signals in response to the surface acoustic waves. The transducers used conventionally comprise interdigitated comb-like electrodes. If such electrodes are deposited on a piezoelectric material the application of alternating electric signals of suitable frequency across the electrodes will tend to propagate a surface acoustic wave orthogonal to the interleaved digits of the comb-like electrodes. Conversely, the passage of a surface acoustic wave orthogonal to the digits will induce a corresponding alternating electrical signal between the electrodes. It is also known that such transducers can operate effectively on an electrostrictive material, if a biassing electric field is applied to the material under the transducers. The transducers may be designed to achieve filtering effects.

Interdigital transducers in their conventional forms of construction are bidirectional. It is a problem particular to systems with devices including bidirectional transducers, that surface acoustic waves incident upon the transducers are reflected due to an acoustic impedance mismatch arising both from the weight loading of the transducer and from the electrical shorting by the conductive digits of the transducer. Also, since at best, maximum power is transferred to and from the acoustic medium when the internal electrical resistance of the transducers is matched to the external resistance of cooperative circuitry, it is generally the case that acoustic waves are regenerated.

In general these systems will therefore respond to delayed spurious signals corresponding to the multiple transits of surface acoustic waves between transducers. The largest of these spurious signals usually arises from surface acoustic waves making a triple transit between transducers. Although unidirectional transducers may be used to eliminate such spurious signal generation, these are complex and generally difficult to produce efficiently for high frequency applications.

Some of the known techniques for triple transit suppression are reviewed in the IEE Conference Publication 109 (1973) at pages 130 to 140. There is also described in the specification of U.K. Pat. No. 1,372,235 with particular reference to FIG. 23 therein, the use of a half-length multistrip coupler for the suppression of triple transit signals. In the device described the multistrip coupler is followed by two parallel output transducers feeding matched and tuned output circuits. A surface acoustic wave is launched on the upper of two tracks and half the power of this wave delivered to each output transducer. Reflected and regenerated waves are channelled to the lower track where they are absorbed. It is a disadvantage that because the power is divided, the output power available at one of the output transducers is 3 dB down on the optimum.

According to the invention there is provided a surface acoustic wave device comprising:

A substrate having two surface acoustic wave propagation tracks; input means, including at least one input transducer, for launching surface acoustic waves on each track, in response to an electrical input signal;

two output transducers, one at the end of each track;

an output coupler having two input ports and two output ports, the two input ports being arranged to couple the two tracks; and, phase differentiation means for providing a non-zero phase difference $\phi$ between the two input ports of the coupler;

the output coupler giving a constructive output signal at one of the output ports when signals of phase difference $\phi$ are presented to the input ports, and an effectively null output signal at this output port when signals of phase difference $3\phi$ are presented.

Conveniently the output transducers may have a common element, being provided thus as a double transducer.

The phase differentiation means may comprise a phase plate. Alternatively, the two output transducers may be staggered with respect to each other to introduce a relative phase difference, the staggered transducers thereby providing the phase differentiation means. In either of these cases, and where the phase difference introduced is 90°, the input means may consist of a single transducer extending across the two tracks.

The input means may comprise a pair of input transducers. The input transducers may be staggered to provide the phase differentiation means.

The output coupling means may include an electrical coupler, external to the two tracks, having two mutually isolated electrical input ports connected one to each of the two output transducers, and two electrical output ports connected each to a matching output load.

Alternatively, the output coupling means may include an acoustic coupler interposed across the two tracks adjacent the two output transducers, having two mutually isolated acoustic input ports, one port for each one of the two tracks, the two output transducers providing the electrical output ports of the coupler each of these electrical output ports being connected to a corresponding matching output load.

The output coupling means may be capable of discriminating between surface acoustic waves, having the provided phase difference, and co-generated bulk acoustic waves.

In a first preferred embodiment of the invention the phase differentiation means includes a phase plate for providing 120° (or 240°) phase difference and the output coupling means includes a 0°/180° hybrid electric coupler. It is an advantage of this embodiment that electrical signals resulting from co-generated bulk waves may be channeled to one only of the electrical output ports of the coupler and dissipated.

In a second preferred embodiment of the invention the input means includes two input transducers and an acoustic coupler for providing the two surface acoustic waves, and the output means includes an acoustic coupler.

It is an advantage of this second embodiment that if one only of the two input transducers is energized, the spurious bulk wave so generated is substantially confined near to one only of the two tracks; the output transducer providing the electrical output signal lying in the other track is not then responsive to this bulk wave.

Embodiments of the invention will now be described, by way of example only, with reference to the accompanying drawings of which:

FIG. 1 is a schematic plan of a surface acoustic wave system including a surface acoustic wave device with connected input and output circuits;

FIGS. 2 and 3 are schematic plans of two alternative transducer configurations for the device of FIG. 1, each with a connected input circuit;

FIG. 4 is a schematic plan of an alternative transducer configuration of a surface acoustic wave device with a connected input circuit for an alternative system; and, FIGS. 5 and 6 are schematic plans of alternative surface acoustic wave systems each including a surface acoustic wave device having acoustic coupling.

Figure 5:
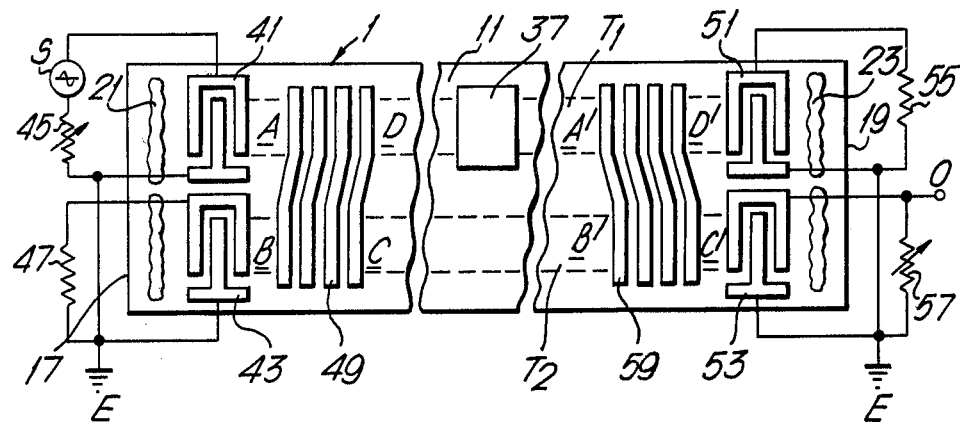

There is shown in FIG. 1 a surface acoustic wave system comprising a surface acoustic wave device 1 with connected input and output circuits 3 and 5, respectively. The device includes two double transducers 7, 9 spaced apart along the length of a substrate 11 of piezoelectric material—eg. lithium niobate $LiNbO_3$.

Each transducer 7, 9 has lower and upper transducer portions each having a multiplicity of paired interleaved digits. The overlap configuration of these digits define acoustic apertures $A_1, A_2, A_3, A_4$ of equal width. The substrate 11 is cut from a single crystal slice with a particular crystallographic orientation so that surface acoustic waves may be excited by the transducer 7 and propagated along the upper plane surface of the substrate 11 in a preferred direction parallel to the length of the substrate 11. Eg. in the z direction of y-cut lithium niobate crystal. The transducers 7, 9 are aligned so that they extend across the width of the substrate 11 with the apertures $A_1$ and $A_3$, $A_2$ and $A_4$ in register so as to define two parallel acoustic tracks $T_1$, $T_2$ of equal width and equal length. A central digit-connecting electrode 13, 15 of each transducer 7, 9 is connected to ground E.

Both transducers 7, 9 are bidirectional, that is they have the property of launching surface acoustic waves both inwardly, towards each other, and outwardly, towards end edges 17, 19 of the substrate 11, in response to alternating voltages applied across the component paired digits. To inhibit transducer response to spurious reflections from the end edges 17, 19, regions of acoustic absorbtive material 21, 23 are provided on the substrate surface between each transducer 7, 9 and the adjacent end edge 17, 19.

An input coupler 25, forming part of the input circuit 3, is connected across one of the transducers 7. It has two electrical input ports A and B, and two electrical output ports C and D. The coupler 25 is in the form of a 0°/180° hybrid coupler and, as connected, provides equal co-phased electrical voltage signals at the coupler output ports C and D when an input signal is applied to input port A. The coupler 25 has the property of providing electrical isolation between the ports C and D when the ports A and B are loaded by equal resistances. To ensure isolation, input ports B and A therefore are connected to ground through resistors 27 and 29 and when a signal source is connected at an input terminal I to port A, the resistor 29 is adjusted to equalize the external resistance on the input side of the coupler 25. To optimize the power transferred through the coupler 25 to the acoustic tracks $T_1 T_2$, the external resistances are matched to the input resistances of the coupler 25 and the output ports D and C are connected to the transducer 7 through matching components (not shown) which are balanced and tuned to match the coupler 25 to the electrical impedances of the transducer 7. This tuning ensures maximum power transfer at the center frequency ie the frequency centered in the pass-band that is characteristic of the transducer 7.

An output coupler 31, forming part of the output circuit 5, is connected across the other transducer 9. This coupler 31 is in the form of a 90° hybrid junction having two input ports $A^1$, $B^1$ and two output ports $C^1$, $D^1$. This coupler 31 has the property of providing electrical isolation between the two input ports $A^1$, $B^1$ when the output ports $C^1$, $D^1$ are loaded by matched resistances. To ensure isolation, the coupler 31 is connected to ground by a fixed dummy resistor 33 at output port $C^1$ and by a variable resistor 35 at output port $D^1$. The fixed resistor 33 has a resistance equal to the output resistance of the coupler and the variable resistor 35 is adjusted to match the internal resistance of external detecting components (not shown, connected to output port $D^1$ at an output terminal O) to the coupler output resistance. Tuned matching components (not shown) are also inserted between the transducer 9 and the coupler 31 to optimize output power transfer.

In the device 1 shown, a single transit 90° phase difference between surface acoustic waves travelling along tracks $T_1$, $T_2$, is introduced by means of a phase plate 37. This phase plate 37 is a metallic film of suitable dimensions arranged and deposited across the upper track $T_1$. It has the property of modifying the propagation velocity of surface acoustic waves travelling along the underlying substrate surface and is of such length that surface acoustic waves travelling underneath, are retarded by 90° phase relative to surface acoustic waves travelling along the lower track $T_2$.

In operation, when an appropriate voltage signal is applied to the input port A of coupler 25 at a system input terminal I, co-phased surface acoustic waves of equal amplitude are launched along the tracks $T_1$ and $T_2$. The surface acoustic wave propagated along the lower track $T_2$ arrives at transducer 9 leading the retarded surface acoustic wave, propagated along the upper track $T_1$, by 90° phase. A significant part of the wave energy, in each case, is converted to electrical energy by transducer 9 and quadrature electrical voltage signals developed across the input ports $A^1$, $B^1$ of the output coupler 31. A summed signal output is provided at the system output terminal O.

Some wave energy, however, is back propagated towards the transducer 7. This arises from reflection at the transducer 9 and also from regeneration by the transducer 9. Again some of this wave energy in the back propagated waves is both reflected at, and regenerated by, transducer 7 and arrives at transducer 9 after further delay. These triple transit waves, in the upper and lower tracks $T_1$, $T_2$, arrive at the output transducer 9 with a relative phase difference of 270°. This phase difference arises because the wave propagated along the upper track $T_1$ passes under the 90° phase plate three times and the relative phase difference is incremented by 90° phase for each of these additional transits. The corresponding electrical signals that are input across the ports $A^1$, $B^1$ of the output coupler 31 thus have a quadrature relationship just the reverse of that for the main signal. A summed signal is thus provided at the dummy output port $C^1$ of the output coupler 31 and dissipated in the dummy load 33.

It is a property of the 90° hybrid junction that a signal input at port $A^1$ is divided into two component signals of equal magnitude emerging at output ports $C^1$ and $D^1$, the component at port $D^1$ leading by 90° phase. Also a signal input at the other input port $B^1$ emerges at ports $C^1$ and $D^1$ as two components of equal magnitudes but with the component at port $C^1$ leading by 90° phase. If two signals of equal magnitude are input across the input ports $A^1$, $B^1$ in quadrature phase, the signal input at port $B^1$ leading by 90°, the components emerging at port $D^1$ add constructively to provide a summed output signal and the components emerging at port $C^1$, being equal in amplitude, but in antiphase, cancel. With the phase quadrature reversed, a summed signal is provided at output port $C^1$.

Other transducer configurations are suitable for launching co-phased acoustic waves. In the alternative construction shown in FIG. 2 co-phased waves are produced by an anti-symmetric double transducer $7^1$ fed by a 0°/180° hybrid coupler $25^1$. When a voltage signal is applied to the input of this coupler $25^1$ two voltage signals of equal magnitude but of opposite phase are developed across the antisymmetric transducer $7^1$. Because this transducer $7^1$ is antisymmetric the acoustic surface waves generated are in-phase (or differ by 360°).

Since in both the above examples the acoustic tracks are isolated, both double transducers could each be replaced by matched single transducer pairs and the tracks could be defined each on a separate substrate.

In the preceding example (FIG. 1) it is sufficient that the two tracks $T_1$, $T_2$ are isolated at the output end of the device 1. The input double transducer 7 may be replaced by a single wide transducer $7^{11}$ as shown in FIG. 3. This transducer $7^{11}$ is fed directly by a signal source S through a matching resistor R. It is noted that the two acoustic tracks $T_1$, $T_2$ are now electrically coupled by the transducer $7^{11}$ and its connected input circuit $3^{11}$ (R and S). Surface acoustic waves reflected or regenerated from the output transducer 9 arrive back at the input transducer $7^{11}$ with the wave in the upper track $T_1$ retarded by 180° phase relative to the wave in the lower track $T_2$.

Since these waves are in antiphase no voltage is generated in the transducer $7^{11}$ and its input circuit $3^{11}$, the waves continue to travel below the transducer $7^{11}$ and are absorbed in the absorbing region 21. Consequently, there is no wave regeneration at this end of the device.

Alternatively, the double transducer 7 of FIG. 1 may be connected with its outermost digits grounded and its innermost digits connected to a signal source. The input circuit then provided is then common to both portions of the double transducer 7.

For devices where surface acoustic wave reflection is small in comparison to surface acoustic wave regeneration and to the co-generation of bulk acoustic waves, the 90° hybrid output coupler 31 of FIG. 1 may be replaced by a 0°/180° coupler and used in conjunction with the input configuration of FIG. 3 or other input configurations having an input circuit common to two like input transducers. In a system thus modified the single transit surface acoustic waves arrive at the two output transducers (double transducer 9) in quadrature phase, and equal magnitude signals are developed by means of the output coupler 31 across the output load and across the dummy resistor load 33. In contrast to this, co-generated bulk acoustic waves unaffected by the 90° phase plate 37, arrive in phase at the two output transducers (double transducer 9). These bulk acoustic waves, being of equal magnitude, produce equal magnitude in-phase signals across the inputs $A^1$, $B^1$ to the output coupler 31. Cancelling electrical signals are provided at the principal output port $D^1$ of the output coupler 31, and summing electrical signals are provided at the other output port $C^1$ of the output coupler 31 and dissipated in the dummy load resistor 33.

Equal magnitude surface acoustic waves, having a 90° phase difference, are regenerated at the output double transducer 9 and propagated back to the input transducer $7^{11}$ (or input transducers). The phase difference between these regenerated surface acoustic waves is incremented by 90° when the acoustic wave on the upper track $T_1$ passes under the phase plate 37. The regenerated surface acoustic waves thus arrive at the input end of the tracks $T_1$, $T_2$ in antiphase. Being in antiphase they do not give rise to any further regeneration.

In the system shown in FIG. 1 the 0°/180° hybrid input coupler 25 may be reconnected so that antiphase surface waves may be launched from the input transducer 7. In this case the connections to output coupler input ports $A^1$, $B^1$ or to output coupler output ports $D^1$, $C^1$ would then be reversed to give equivalent operation.

Relative phase shift between the surface acoustic waves propagated along the two tracks $T_1$, $T_2$ may be introduced by means other than the phase plate 37. Thus in the part of the device 1 shown in FIG. 4, quadrature phase waves are launched by a modified double transducer 39. The digit pairs forming the lower portion of this transducer 39 are displaced lengthwise by a quarter wavelength relative to the digit pairs forming the upper portion. The acoustic path length for track $T_1$ exceeds the path length for track $T_2$ and a phase shift of 90° is introduced for each transit of the waves between the transducers 39 and 9.

In all the examples above a phase difference of 270°, 450° ...; $180n \pm 90°$ for integer n, could be introduced by change of the phase plate or of the transducer displacement.

In an alternative and preferred embodiment of the invention, the phase plate 37 is constructed to insert a relative phase delay of 120° and the 90° hybrid junction 31 is replaced by an output coupler 31 in the form of a 0°/180° hybrid coupler, with input ports $A^1$, $B^1$, and output ports $C^1$, $D^1$.

It is a property of the 0°/180° hybrid coupler, as connected, that a signal input at port $A^1$ is divided into two component signals of equal magnitude emerging at ports $C^1$ and $D^1$, the component at port $D^1$ being retarded by 180° phase. Also a signal input at port $B^1$ is divided into two component signals of equal magnitude but in phase. If two signals of equal magnitude and phase are input across the input ports $A^1$, $B^1$ of the hybrid coupler 131, the component signals at port $C^1$ add constructively, whereas the component signals at port $D^1$ cancel.

In operation, acoustic waves launched from the input transducer 7 arrive at the output transducer 9, the surface wave in the upper track $T_1$ being retarded by 120° relative to the wave in the lower track $T_2$. These waves interact with transducer 9 to develop voltage signals across the ports $A^1$, $B^1$ of the coupler 31 and the signals are combined constructively to provide a summed output signal at the output port $D^1$ of the output coupler 31. However, since the input voltage signals are 120° apart in phase some of the power is also channeled into the dummy load 33 and the useful output is reduced by 1 db below optimum. The triple transit waves caused by reflection, regeneration, or by both, however, arrive at the transducer 9 with a phase difference of $3 \times 120°$ ie. 360° and develop in-phase voltage signals across the output coupler 31. These voltage signals being in phase and of equal magnitude produce a null output at the output port $D^1$ of the coupler 31 and are wholly dissipated in the dummy load 33.

It is an advantage of this embodiment that any bulk mode acoustic waves launched by the input transducer, which are not retarded by the phase plate 37 and which propagate along the two acoustic tracks T1 and T2 in an equivalent manner (including any equivalent reflection from the bottom surface), also arrive at transducer 9 in phase and produce voltage signals which cancel at the output port $D^1$ of the coupler 31. To reduce the non-cancelling of bulk waves which arrive at transducer 9 after traversing non-equivalent paths because of geometrical properties of the bottom surface relative to the top one, the substrate base may be slotted, rotated, pitted or roughened in such manner as is well known for bulk wave suppression.

Using a substrate 11 of x-direction propagating ST cut quartz material for the device 1 of this last mentioned alternative system, it is found that the longitudinal mode bulk wave $\sim 1.8$ times the frequency of the surface acoustic wave is suppressed. However, it is also found that the faster shear mode bulk wave $\sim 1.6$ times the frequency of the surface acoustic wave, is influenced by the presence of the phase plate 37 and a relative phase shift of $\sim 180°$ is introduced, producing a spurious summed signal at the output port $D^1$ of the output coupler 31. This spurious signal may be removed, however, by doubling the length of the phase plate 37. Using a phase plate 37 providing instead, a 240° phase delay for surface waves, also providing at the same time a 360° phase delay for the fast shear mode bulk wave, the spurious summed signal is channelled to the dummy port $C^1$ of the coupler 31.

The triple transit surface wave signals and the bulk waves would be suppressed by a 240° delay plate used in place of the 120° delay plate.

It is also possible to replace one, or both, of the electrically coupled input and output couplers 25 and 31, in the form of 0°/180° electrical hybrid couplers, by acoustic couplers, and an example of acoustic coupling is shown in FIG. 5. The device 1 shown in this figure includes two input transducers 41 and 43. The first of these transducers 41 is connected across a signal source S and a variable resistance 45. The second of these transducers 43 is identical to the first 41. It is connected across a fixed resistor 47, having a resistance equal to the input resistance of the second transducer 43. Resistor 45 is adjusted so that the external resistance in the signal source circuit is equal to the like input resistance of the first transducer 41. There is also provided an acoustic coupler 49 adjacent and to the inward side of these two transducers 41 and 43 having two acoustic input ports A and B, and two acoustic output ports D and C, directly coupled to tracks $T_1$ and $T_2$ respectively. This acoustic coupler comprises a multiplicity of equispaced metal strips which are deposited on the substrate 11 and extend across the two acoustic surface wave tracks $T_1$, $T_2$. The number, width and spacing of these strips are chosen to provide a half-length coupler (cf. U.K. Patent Ser. No. 1,372,235). The upper portion of each strip is displaced inwardly relative to each corresponding lower strip portion by a quarter of a wavelength (ie. the pass-band center wavelength). When the first transducer 41 is energized, the surface acoustic wave generated and propagated along track $T_1$ is divided into two co-phase surface waves of equal amplitude, and propagated inwardly from the right-hand side of the coupler 49.

Two receiving transducers 51, 53 are provided at the other end of the device 1. These are constructed as an identical pair. The first of these, transducer 51 is connected across a matching resistor 55, and, the second of these, transducer 53 is connected across a variable resistor 57. The resistance of this resistor 57 is adjusted to match the transducer internal resistance to the resistance of any output load connected to system output terminal O.

The circuits of the input transducers 41 to 43, and, of the output transducers 51, 53, are turned to the bandpass center frequency of operation. There is provided a second acoustic coupler 59 similar to the input coupler 49 but differing in that it is the lower strip portions that are now displaced to the right of the upper strip portions. It has two acoustic input ports $A^1$, $B^1$ and two acoustic output ports $C^1$, $D^1$.

On the upper track $T_1$, between the input coupler 49 and the output coupler 59, there is a 120° phase plate 37.

In operation, when the input transistor 41 is energized, a surface acoustic wave is generated and propagated along the upper track $T_1$ towards the input coupler 49. As it passes under this coupler 49, acoustic energy is transferred to the other track $T_2$ and two surface acoustic waves emerge to the right of the input coupler 49. These surface acoustic waves are of equal magnitude and in-phase. Any spurious bulk wave that is generated by the input transducer 41 is not significantly coupled by the input coupler 49 and continues in transit below track $T_1$ to the output transducer 51 where it is detected. The energy transferred from this bulk wave is dissipated in the dummy resistor 55.

The two co-phased surface waves are then propagated towards the receiving transducers 51 and 53, the surface acoustic wave on the upper track $T_1$ being retarded by 120° phase relative to the surface acoustic wave on the lower track $T_2$, as it passes under the phase plate 37.

On interaction with the coupler 59 the surface wave on the upper track is divided into two components of equal magnitude differing in phase by 180°. The other surface wave, on the lower track, is divided into two co-phase waves of equal magnitude. The component waves travelling on the upper track $T_1$ to the right of the coupler 59 are 120° out of phase, those on the lower track $T_2$ being only 60° out of phase. The available output power developed across the resistor 55 and the output O is thus divided in the ratio 1:3, the greater fraction of the power being available at the output O.

A fraction of the surface wave power incident upon the receiving transducers 51, 53 is in part, reflected and in part, regenerated, and propagated back towards the output coupler 59. On passing under the output coupler 59, in this reverse direction, the surface waves are recombined to produce on each track $T_1$, $T_2$ surface waves of equal amplitude but differing in phase by 120°. The combination of the acoustic coupler 59 and the pair of like transducers 51 and 53 terminated by matched output circuits, provides isolation between the acoustic input ports $A^1$, $B^1$.

Thus as seen above both the phase relationship and the equality of amplitude of the surface waves incident upon the output coupler 59 are conserved in the back propagated surfaces waves leaving this coupler 59 albeit the amplitude of the waves is significantly reduced by the transfer of power to the transducer output circuits.

The reflected and regenerated surface waves travel back towards the input coupler 49, are redistributed, attenuated, reflected and regenerated from the first two transducers 41 and 43, are recombined by input coupler 49, and emerge to the right of phase plate 37 with equal amplitude and a relative phase difference between tracks $T_1$ and $T_2$ of $3 \times 120° = 360°$. These surface waves are then recombined by the output coupler 59 and channelled to the output port $D^1$ only. Because of the antiphase interference of waves of equal amplitude no energy is transferred to the other output port $C^1$. These triple transit waves thus develop a voltage across the output circuit of the dummy output transducer 51 only.

In the device 1 of FIG. 5, the 120° phase plate 37 may be replaced by a 240° phase plate to produce a similar result. Either of these phase plates may be positioned, instead, across the other track $T_2$.

The couplers 49 and 59 are most suitable for narrow band response systems. Where a wider band response system is required, however, asymmetric acoustic couplers of appropriate construction may be used instead of the couplers 49 and 59 shown. In an asymmetric coupler, the width and spacing of the metallic strips differ for the upper and lower portions and may be chosen to provide analogous response.

Figure 6:
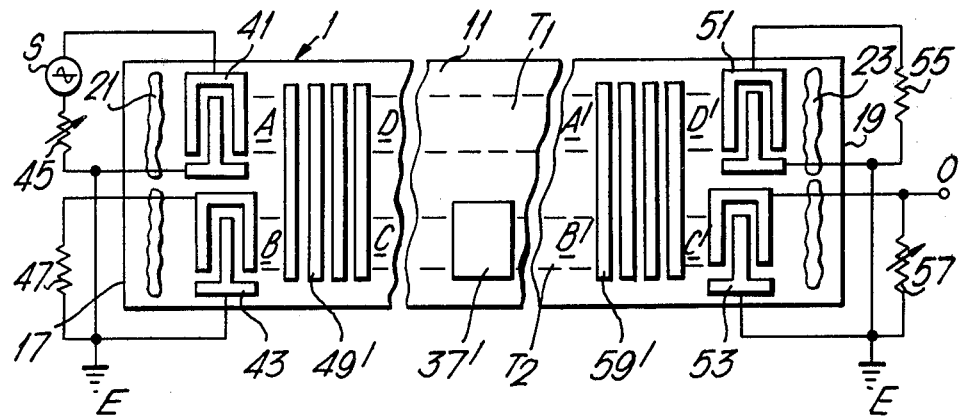

An alternative, acoustically coupled, system is shown in FIG. 6. The input transducers 41 and 43 are staggered by one quarter of a wavelength, as also are the output transducers 51 and 53, the lower transducers 43 and 53 being the closer spaced. Straight multi-strip half-length acoustic couplers $49^1$ and $59^1$ replace the staggered couplers 49 and 59 of FIG. 5. Between the two couplers $49^1$ and $59^1$ is a 60° phase plate $37^1$, lying across the lower acoustic track $T_2$. As in the previous example the main signal power is divided in the ratio 1:3, the greater fraction being available at the output O, and the triple transit signal is dissipated in the dummy circuit resistor 55.

The 60° phase plate $37^1$ may also be repositioned across the other track $T_1$ or it may be replaced by a 300° phase plate across either of the two tracks $T_1$ or $T_2$.

The phase plate $37^1$ may also be replaced by a 120° or 240° phase plate positioned across either track provided that the output signal is taken from the other output transducer 51. This choice is, however, less attractive as this output is sensitive to co-generated bulk waves.

Referring to FIG. 1, an alternative scheme uses the 0°/180° hybrid input coupler 25, and 90° output coupler 31, a 180° phase plate 37 across the lower track $T_2$ (not $T_1$ as shown) and with the lower part of the double transducer 7 staggered inwards by an offset of 90°. The single transit signal is summed at the output O, whereas the triple transit signals are directed into the dummy load 33, as also any bulk wave signals are unaffected by the phase plate 37.

In describing the above examples it has been assumed that the input and output transducers are matched and that the propagation tracks are of equal width and uniform propagation characteristic. In practice, due to manufacturing tolerance, this may not always be achieved. This may thus result in differences in amplitude between waves propagated along the upper and lower tracks $T_1$, $T_2$ and a resultant departure from exact null conditions. If the null would in consequence be less than effective, external phase or amplitude compensation may be introduced by using e.g. selective attenuation at input, or, where electrical coupling is used, between the output transducers and the coupler to achieve better tolerance.

In some device configurations it may be found that certain of the co-generated bulk waves are influenced by the presence of the phase plate. It has been observed that the phase plate can in some circumstances have a guiding effect on bulk waves, producing an enhanced response to those waves at output and consequently producing an inbalance. With come compromise, selective attenuation may be used, or different track widths may be used to some advantage.

It is to be noted that in all of the above examples the devices are reciprocal, as also are the electrical couplers—ie. the devices may be operated in reverse, with an input signal applied to the output terminal O and an output signal taken from the input terminal I. No significance is attached to the particular choice of input and output used for the purpose of description.

I claim:

1. A surface acoustic wave device comprising:
   a substrate having two surface acoustic wave propagation tracks;
   input means, at one end of the two tracks, including at least one input transducer, for launching surface acoustic waves on each track, in response to an electrical input signal;
   two output transducers, one at the end of each track;
   an output coupler having two input ports and two output ports, the two input ports being arranged to couple the two tracks; and,
   phase differentiation means for providing a non-zero phase difference $\phi$ between the two input ports of the coupler;
   the output coupler giving a constructive output signal at one of the output ports when signals of phase difference $\phi$ are presented to the input ports, and an effectively null output signal at this output port when signals of phase difference $3\phi$ are presented.

2. A device as claimed in claim 1 wherein the input means comprises one single input transducer extending across the two tracks.

3. A device as claimed in claim 1 wherein the input means comprises one input transducer on one track, a dummy transducer on the other track, and a multistrip acoustic input coupler coupling the two tracks, said acoustic input coupler lying adjacent to said input and dummy transducers, between said dummy and input transducers and said two output transducers.

4. A device as claimed in claim 1 wherein the input means includes two input transducers, one on each track.

5. A device as claimed in claim 1 wherein the output coupler is an electrical coupler, the input ports of which are connected to the output transducers to couple the two tracks.

6. A device as claimed in claim 1 wherein the output coupler is a multistrip acoustic coupler located on the input side of the two input transducers.

7. A device as claimed in claim 1 including a phase plate on one of the tracks, for providing the phase differentiation means.

8. A device as claimed in claim 1 having tracks of different length, for providing the phase differentiation means.

9. A system including a surface acoustic wave device comprising:
- a substrate having two surface acoustic wave propagation tracks;
- input means, at one end of the two tracks, including at least one input transducer, for launching surface acoustic waves on each track, in response to an electrical input signal;
- two output transducers, one at the end of each track;
- an output coupler having two input ports and two output ports, the two input ports being arranged to couple the two tracks; and,
- phase differentiation means for providing a non-zero phase difference $\phi$ between the two input ports of the coupler;
- the output coupler giving a constructive output signal at one of the output ports when signals of phase difference $\phi$ are presented to the input ports, and an effectively null output signal at this output port when signals of phase difference $3\phi$ are presented; and,
- two matched loads one connected to each output port of the output coupler, providing isolation between the two tracks.

10. A surface acoustic wave device comprising: a substrate of piezoelectric material having two surface acoustic wave propagation tracks; a pair of input transducers, one corresponding to each track, for launching surface acoustic waves on each track; a pair of output transducers, one corresponding to each track, spaced from the input transducers, for receiving surface acoustic waves on each track; an electrical 0°/180° hybrid input coupler connected to the pair of input transducers; an electrical 90° hybrid output coupler connected to the pair of output transducers; and a phase plate, cooperative with one of the two tracks, for retarding surface acoustic waves by $(180n\pm90)°$ phase, integer n, for each transit made thereunder.

11. A surface acoustic wave device comprising: a substrate of piezoelectric material having two surface acoustic wave propagation tracks; a pair of input transducers, one corresponding to each track, for launching surface acoustic waves on each track; a pair of output transducers, one corresponding to each track, spaced from the input transducers, for receiving surface acoustic waves on each track; an electrical 0°/180° hybrid input coupler connected to the pair of input transducers; an electrical 0°/180° hybrid output coupler connected to the pair of output transducers; and a phase plate, cooperative with one of the two tracks, for retarding surface acoustic waves by $(360n\pm120)°$ phase, integer n, for each transit made thereunder.

12. A surface acoustic wave device comprising: a substrate of piezoelectric material having two surface acoustic wave propagation tracks; a pair of input transducers, one corresponding to each track, for launching surface acoustic waves on each track; a pair of output transducers, one corresponding to each track, spaced from the input transducers, for receiving surface acoustic waves on each track; a half length input multistrip coupler adjacent to the input transducers, coupling the two tracks; a half length output multistrip coupler adjacent to the output transducers, also coupling the two tracks; one of said couplers having a stagger of one quarter of a wavelength such that the spacings between couplers on each of the two tracks differ by one half of a wavelength; and, a phase plate, cooperative with one of the two tracks, located between the couplers, for retarding surface acoustic waves by $(360n\pm120)°$ phase, integer n, for each transit made thereunder.

13. A surface acoustic wave device comprising: a substrate of a piezoelectric material having two surface acoustic wave propagation tracks; a pair of input transducers, one corresponding to each track, for launching surface acoustic waves on each track; a pair of output transducers, one corresponding to each track, spaced from the input transducers, for receiving surface acoustic waves on each track; the transducers in each pair being staggered by one quarter of a wavelength such that the transducers cooperative with one of the tracks are closer, by one half of a wavelength, than the transducers cooperative with the other track; two half-length multistrip couplers extending across the two tracks, located between the input and output transducers; and a phase-plate, cooperative with one of the two tracks, located between the two couplers, for retarding surface acoustic waves by $\phi°$ phase, for each transit made thereunder, the phase increment $\phi$ have one of the values (60, 120, 240, or 300)°.

* * * * *